United States Patent
Heid et al.

(10) Patent No.: US 6,462,547 B1
(45) Date of Patent: Oct. 8, 2002

(54) MAGNETIC RESONANCE TOMOGRAPHY APPARATUS HAVING A GRADIENT COIL SYSTEM WITH A STRUCTURAL DESIGN WHEREIN A SCALAR PRODUCT OF A NATURAL OSCILLATION MODE AND LORENTZ FORCES IS MINIMIZED TOWARD ZERO

(75) Inventors: Oliver Heid, Gunzenhausen; Peter Dietz, Nuernberg; Ralph Kimmlingen, Erlangen, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/520,175

(22) Filed: Mar. 7, 2000

(30) Foreign Application Priority Data

Mar. 8, 1999 (DE) .......................... 199 10 017
Jun. 16, 1999 (DE) .......................... 199 27 494

(51) Int. Cl.$^7$ ................................ G01V 3/00
(52) U.S. Cl. ..................................... 324/318
(58) Field of Search .................. 324/318, 319, 324/322.316, 314, 320, 309, 307, 306, 321

(56) References Cited

U.S. PATENT DOCUMENTS

| | | | |
|---|---|---|---|
| 5,345,177 A | | 9/1994 | Sato et al. ................... 324/318 |
| 5,661,399 A | * | 8/1997 | Sellers ........................ 324/318 |
| 5,698,980 A | | 12/1997 | Sellers et al. ................ 324/318 |
| 5,764,059 A | * | 6/1998 | Mansfield et al. ........... 324/318 |
| 6,107,799 A | * | 8/2000 | Sellers et al. ................ 324/318 |
| 6,353,319 B1 | * | 3/2002 | Dietz et al. .................. 324/318 |

* cited by examiner

Primary Examiner—Edward Lefkowitz
Assistant Examiner—Tiffany A. Fetzner
(74) Attorney, Agent, or Firm—Schiff Hardin & Waite (57) ABSTRACT

Magnetic resonance tomography device has a gradient coil system that is fashioned such that the natural oscillation modes of the gradient coil system and the Lorentz forces are optimally orthogonally oriented toward one another, and a scalar product of the natural oscillation mode and the Lorentz force is formed for each point of the gradient coil system. A summation of these products, results in a value that is as close to zero as possible for each natural oscillation mode with the natural oscillation modes being prescribed by a weight- and/or spring rigidity distribution of the carrier structure, by weights that are introduced into the carrier structure and/or by components that modify the spring rigidity, or by heavy end rings and/or by setting the Lorentz forces by fashioning the conductor arrangement of the primary coil and/or a secondary coil, if present, and/or additional conductor sections given tubular gradient coil systems.

25 Claims, 9 Drawing Sheets

MAGNETIC RESONANCE TOMOGRAPHY APPARATUS HAVING A GRADIENT COIL SYSTEM WITH A STRUCTURAL DESIGN WHEREIN A SCALAR PRODUCT OF A NATURAL OSCILLATION MODE AND LORENTZ FORCES IS MINIMIZED TOWARD ZERO

BACKGROUND OF THE INVENTION

1. Field of the Invention

The present invention is directed to a magnetic resonance tomography device, of the type having a basic field magnet and a gradient coil system, formed by gradient coils and a carrier structure.

2. Description of the Prior Art

Magnetic resonance tomography is a known modality for the acquisition of images of the inside of a body of the living patient. For this purpose, dynamic magnetic fields with a linear gradient are superimposed on the static basic magnetic field in three spacial directions in magnetic resonance tomography devices. Currents flow in the gradient coils, whose amplitudes reach several 100 A and which are subject to frequent and rapid changes of the current direction with rise rates and fall rates of several 100 kA/s. These currents are controlled by pulse sequences, which are provided by a control system, and cause oscillations that lead to the noise due to Lorentz forces, given a basic magnetic field that is on the order of magnitude of 1 Tesla.

A series of measures have been proposed in order to reduce the noise of the gradient coil system. For example, the rigidity of the gradient coil system has been increased and/or the gradient coils have been acoustically damped or insulated and/or the fastening of the gradient coil system has been modified. For example, the U.S. Pat. No. 5,698,980 describes fastening a tube-shaped gradient coil system at its dominant natural oscillation node at the inner cynical surface of the housing of the basic field magnet. Such modified fastening, however, does not achieve a significant noise reduction, since the gradient coil system is the most rigid element of the entire device.

Further developments in the field of the magnetic resonance tomography for shortening measuring times and improving imaging properties are associated with ever faster pulse sequences. These sequences employ even higher current amplitudes and faster current rise rates and current fall rates in the gradient coils. Such larger gradient coil currents, due to increasing Lorentz forces, lead to ever greater amounts of noise without counter-measures. Such faster pulse sequences cause ever more rapid and frequent changes of the current direction in the gradient coils. As a result, the dominant spectral portions of the gradient coil currents shift to higher frequencies. The oscillation excitation of the gradient coil system is maximal and the produced noise is extremely great when one of these portions has the same frequency as a natural frequency of the gradient coil system. Such an excitation with ever faster pulse sequences becomes more likely.

For example, an increase of the rigidity can be one response to larger gradient coil currents and faster pulse sequences. Merely an increase of the natural frequencies by the factor of approximately 1.4 can be achieved by doubling the rigidity. The increase of the rigidity is technically and economically limited, since the current gradient coil system is already an extremely rigid element.

SUMMARY OF THE INVENTION

An object of the present invention is to provide a gradient coil system that inhibits the process of the noise development and therefore reduces the occurring noise.

The object is inventively achieved in a gradient coil system wherein the natural oscillation modes of the gradient coil system (or at least noise-producing natural oscillation modes) and the oscillation-exciting Lorentz forces, which result from the gradient coil currents and from the static basic magnetic field, are optimally orthogonally oriented relative to one another for noise reduction. As used herein, the phrase "optimally orthogonally oriented" means that the natural oscillation modes which contribute to noise production are oriented, relative to the Lorentz forces, as close to "ideal" orthogonality as is practical, given the structural and operational limitations of the device. The term "optimally orthogonally oriented" thus means the substantially orthogonal relationship which results in the maximum amount of noise reduction, given the aforementioned practical limitations. More specifically, in the inventive magnetic resonance device the natural oscillation modes of the gradient coil systems which contribute to noise production are optimally orthogonally oriented relative to the Lorentz forces such that a scalar product of a natural oscillation mode and the Lorentz force for each point of the gradient coil system, with a subsequent summation over all points of the gradient coil system, results in a value that is as close to zero as possible for each natural oscillation mode of the gradient coil system which contributes to noise production to any significant degree.

Only the noise-producing natural oscillation modes are taken into consideration in one embodiment of the invention. This has the advantage that the inventive fashioning of the gradient coil system is simpler due to a few free parameters given remaining high efficiency. The noise-relevant natural oscillation forms are particularly the ones that exhibit a high spatial conformity with the Lorentz force distribution.

In another embodiment, the natural oscillation modes are fixed by weight distribution and/or rigidity distribution of the carrier structure. Except the gradient coils, the term "carrier structure" means all other elements of the gradient coil system, which, together with the gradient coils, determine the natural oscillation modes. Therefore, central carrier elements, casting material, cooling means, shim means and possibly high frequency transmission means and high frequency reception means normally belong to the carrier structure.

In a further embodiment, in the gradient coil system weights are introduced into the carrier structure and/or components are introduced into the carrier structure that alter the elastic rigidity thereof. Particularly advantageous is that the layout of the gradient coil system, which is primarily directed to the generation of a magnetic field with a linear gradient, is only insignificantly changed. Given compound-filled (potted) gradient coil systems, weights are introduced at the locations at which casting material is otherwise present, for example. In contrast to the introduction of acoustic insulating material, for example, the inventive fashioning of the gradient coil system does not cause an increase in volume of the gradient coil system. This is particularly advantageous for magnetic resonance tomography devices with a superconductive basic field magnet and a cylindrical patient opening.

In another embodiment, rings that are similar to the tube cross section are firmly connected to the gradient coil system at at least one of the ends given a tube-shaped gradient coil system. Thereby, the inventive fashioning is achieved in an extremely simple manner. The basic concept of a currently employed tube-shaped gradient coil system is hardly changed. Even comparatively large weights are thus introduced into the gradient coil system without space problems.

In a further embodiment, rings that are similar to the tube cross section are connected to the gradient coil system at at least one of the ends via an intermediate layer made of elastic material, given a tube-shaped gradient coils system. Apart from the inventive fashioning of the gradient coil system, this has the particular advantage that oscillation energy is withdrawn from the oscillating system and is converted into heat energy. The damping is thereby increased and the oscillation amplitude is lowered, and as a result the noise is further reduced.

In another advantageous embodiment, the rings are composed of material of high-density. Heavy weights are thereby realized given small dimensions of the rings. This means a high noise-reducing effect given a small additional volume.

In an embodiment employing the elastic material, the elastic material has a hysteresis loop in the force-deformation-diagram; the area bounded by the hysteresis loop is so large that the elastic material absorbs much oscillation energy of the gradient coil system. The area encompassed by the hysteresis loop is a direct measure for the work that is to be applied during a cycle. As a result, much oscillation energy is withdrawn from the oscillating gradient coil system and is converted into heat as a result of the large area of the hysteresis loop. Therefore, the noise-reducing effect is significant.

In another embodiment, the Lorentz forces are prescribed by the conductor arrangement of the gradient coils. A noise-optimized conductor arrangement is achieved via three basic methods. In a first method, the conductor sections are displaced with respect to a gradient coil and the result is checked by means of control calculations until the desired optimization is achieved. In a second method, additional conductor sections are added to a gradient coil. In a third method, the additional parameter of the noise-optimized conductor arrangement is a part of the gradient coil design from the beginning.

In a further embodiment, the Lorentz forces are determined by the conductor arrangement of the secondary coil in a gradient coil that comprises a primary coil and a secondary coil. As a result, effects on the gradient field, particularly in the area of the imaging volume of the device, remain calculable.

In another embodiment, the Lorentz forces are determined by arranging at least one conductor section which is disposed in an area outside of the winding layers of the primary coils and, if present, outside of the secondary coils, within the gradient coil system, and which is integrated into at least one gradient coil circuit. This enables fashioning of the gradient coil system without modifying its primary coil design and, if present, without modifying the secondary coil design.

In a further embodiment, the conductor arrangement is fashioned in at least one area of the gradient coil system which is as remote as possible from the imaging volume. This has only slight effects on the quality of the gradient field in the imaging volume, which is important for a high magnetic resonance image quality.

In another embodiment, the conductor arrangement is fashioned in at least one area of the gradient coil system, which contains at least one oscillation node of at least one natural oscillation mode, preferably a natural oscillation mode which contributes to noise generation. As a result, degrees of freedom are acquired in the conductor arrangement while taking at least two noise-producing natural oscillation modes into consideration at the same time. Additional conductor sections that have a gradient coil current flowing therein in the same direction are added in the area that is remote from the imaging volume,.for example, for optimizing the noise with respect to a first noise-producing natural oscillation mode. The additional conductor sections are connected to conductor sections in the area of an oscillation node of the first natural oscillation mode for forming a complete circuit. The noise behavior of the first natural oscillation mode is only insignificantly influenced by the last of these conductor sections in the area of the oscillation node. Noise optimization of a second natural oscillation mode is achieved by more additional conductor sections, in the area that is remote from the imaging volume, than are necessary for the noise optimization of the first natural oscillation mode, as well as by means of a corresponding arrangement of the conductor sections in the area of the oscillation node.

DESCRIPTION OF THE PREFERRED EMBODIMENTS

Figure 1:
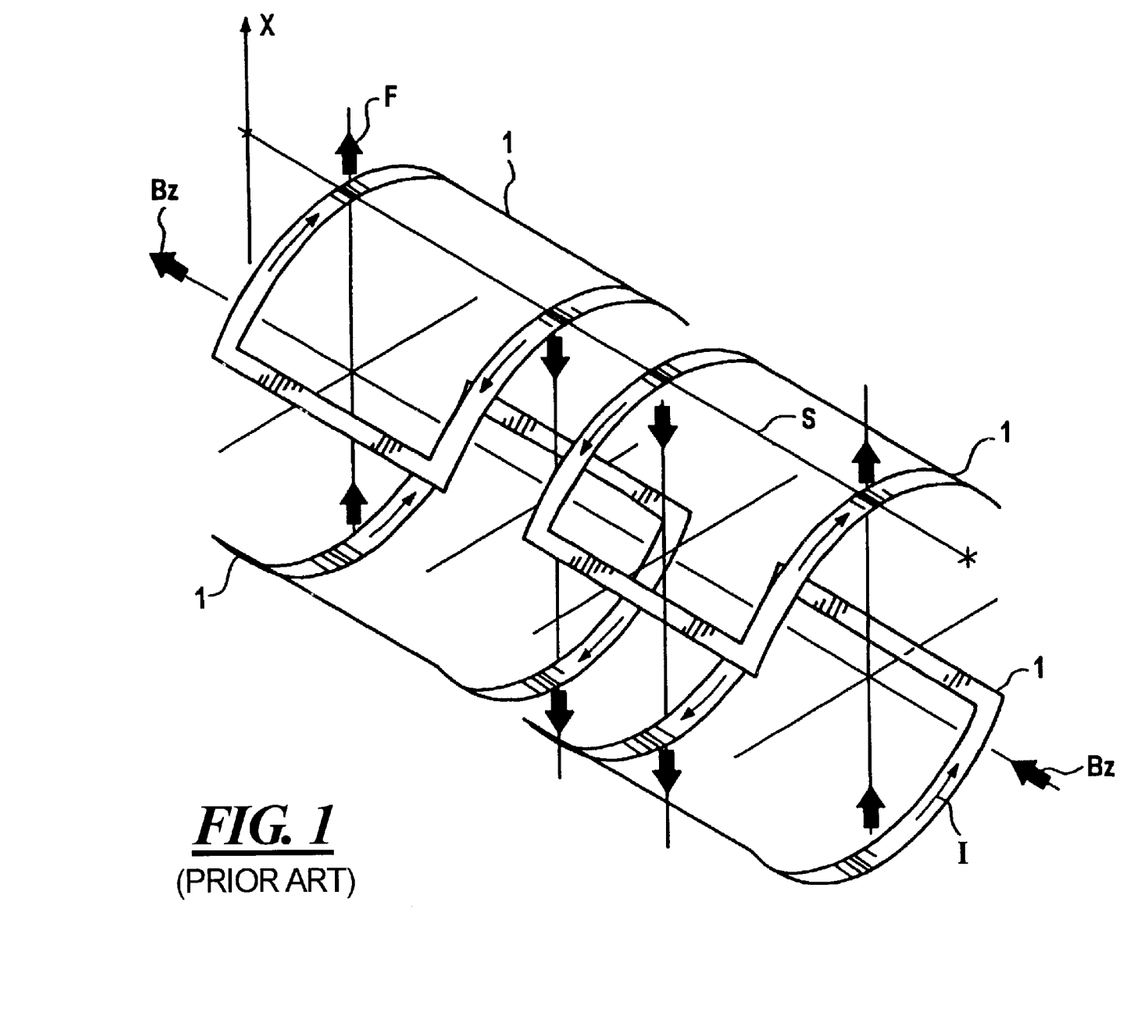
FIG. 1 is a schematic diagram of a tube-shaped gradient coil arrangement.

FIG. 1 shows an exemplary embodiment of a gradient coil in the form of a schematic diagram. The tube-shaped gradient coil forth generation of a gradient field for a spatial direction is typical for magnetic resonance tomography devices with a cylindrical patient opening. Only a few conductor sections 1 of the gradient coil are shown as examples for simplicity. The gradient coil is a current I flowing therein. The flow of current causes Lorentz forces F in the static basic magnetic field Bz. The arising Lorentz forces are radially directed due to the conductor arrangement and the direction of the basic magnetic field. In the longitudinal direction, the spatial distribution of the Lorentz forces is axially symmetrical relative to the center of the length of the gradient coil. The time-variable currents in the gradient coil generate corresponding Lorentz forces that have an effect on the conductor sections of the gradient coil and set the gradient coil system oscillating, producing noise.

Figure 2:
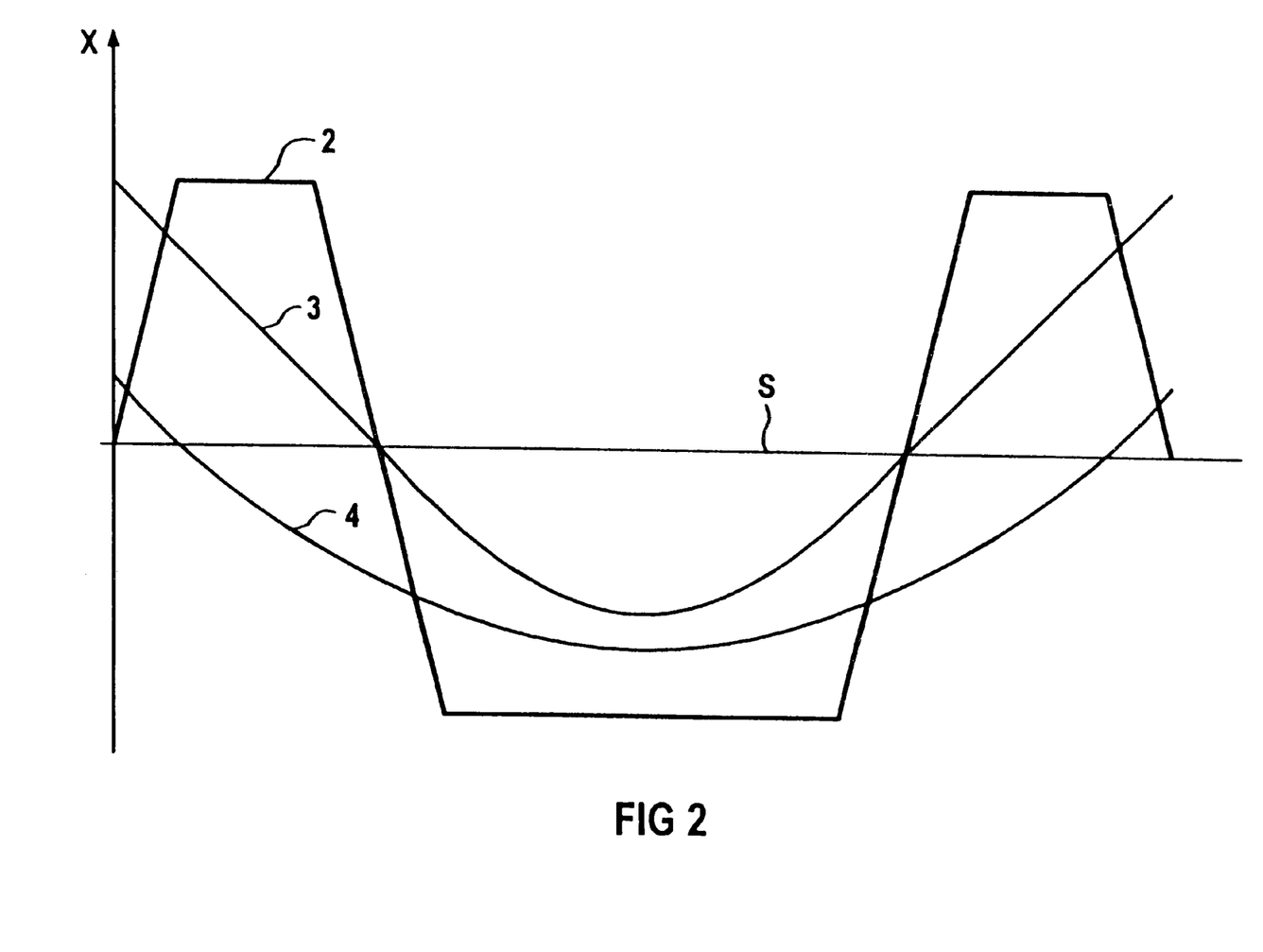
FIG. 2 shows a basic distribution of the Lorentz forces and a noise-producing natural oscillation mode of a gradient coil system with and without the inventive fashioning of the carrier structure.

FIG. 2 shows three curves along the intersection line S from FIG. 1 and in the direction of the coordinate axis x from FIG. 1. Curve 2 shows the basic Lorentz force distribution, curve 3 shows a noise-relevant natural oscillation mode of the gradient coil system without the inventive fashioning of the carrier structure and curve 4 shows a natural oscillation mode with the inventive fashioning of the carrier structure.

The natural oscillation behavior of a gradient coil system is determined by the natural frequencies and by the natural oscillation modes. The effect of the Lorentz forces on the natural oscillation modes is described in the form of the participation factors. These indicate how intense the Lorentz forces excite a specific natural oscillation mode. Mathematically, the scalar product between the Lorentz force at a point and the vector that describes the natural oscillation motion at this location is formed for this purpose. These scalar products are determined for each point of the gradient coil system and are added. A participation factor of a natural oscillation mode results therefrom. The natural frequencies are determined by the material parameters of the gradient coil system. Due to the knowledge of the participation factors and the natural frequencies, the oscillation of the gradient coil system can be determined for each location and for each frequency by superimposing oscillations of the individual natural oscillation modes. The oscillations are forwarded via different spreading paths at the surfaces of the magnetic resonance tomography device. The surface velocity determines the transmission of the mechanical oscillation into the acoustic oscillation and is composed of the superimposition of the oscillations of the individual transmission paths. This surface velocity determines the noise of the device in connection with the geometry of the surface.

The scalar products are always zero when the Lorentz forces and the natural oscillation modes are orthogonal to one another at all points of the gradient coil system and for all natural oscillation modes. Such a gradient coil system does not generate noise. The distribution of the Lorentz forces is prescribed due to the conductor arrangement for generating a desired gradient field. Due to geometric limitations and material properties, it is not possible to fashion a gradient coil system such that the orthogonality to the Lorentz forces is fulfilled for all natural oscillation modes and for all points of the gradient coil system.

A natural oscillation mode does not contribute to noise when its participation factor is zero. When, for the above cited reasons, is not possible for all scalar products of a participation factor to equal zero, it is possible to control the distribution of positive and negative scalar products such that a participation factor for the relevant natural oscillation mode is as close to zero as possible, after the summation over all points of the gradient coil system.

This means for the two-dimensional view shown in FIG. 2 that a characteristic number is obtained, which is comparable to the participation factor determined in the three-dimensional case, by multiplying the Lorentz force distribution by a natural oscillation mode and integrating the products along the intersection line S. The noise-producing natural oscillation mode 3 without the inventive fashioning of the carrier structure shows an almost perfect spatial conformity With the Lorentz force distribution. The characteristic number that is determined by means of multiplication and subsequent integration is correspondingly large. This is equivalent to high noise. A multiplication of the natural oscillation mode 4 with the inventive fashioning of the carrier structure with the Lorentz force distribution results in a curve that extends above the intersection line S and below the intersection line S. As a result, an integration of this curve along the intersection line S results in a significantly smaller characteristic number compared to the gradient coil system without the inventive fashioning. This means less noise. The natural oscillation mode 4 derives from the natural oscillation mode 3, for example, by fastening heavy rings at the ends of the tube-like gradient coil system.

Figure 3:
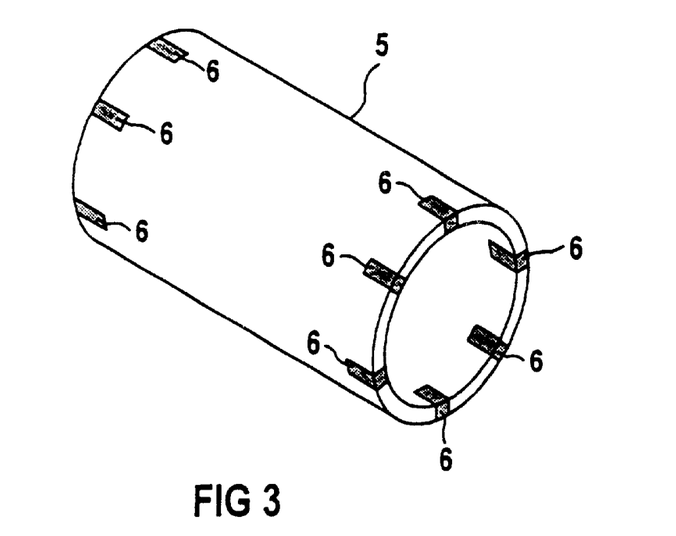
FIG. 3 is a schematic diagram of a tube-shaped gradient coil system with weights introduced into the carrier structure.

FIG. 3 shows an exemplary embodiment in the form of a schematic diagram for an inventive fashioning of the carrier structure wherein weights 6, in the end areas, are integrated into the carrier structure of a tube-like gradient coil system 5.

Figure 4:
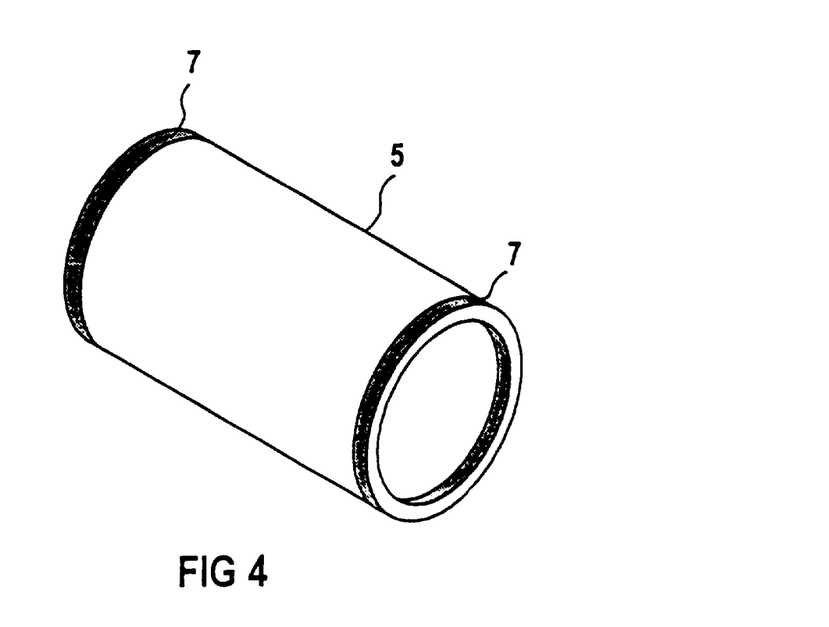
FIG. 4 is a schematic diagram of a tube-shaped gradient coil system with end rings.

FIG. 4 shows an exemplary embodiment in the form of a schematic diagram for an inventive fashioning of the carrier structure wherein rings 7 are firmly connected to the gradient coil system at both ends of a tube-like gradient coil system 5.

Figure 5:
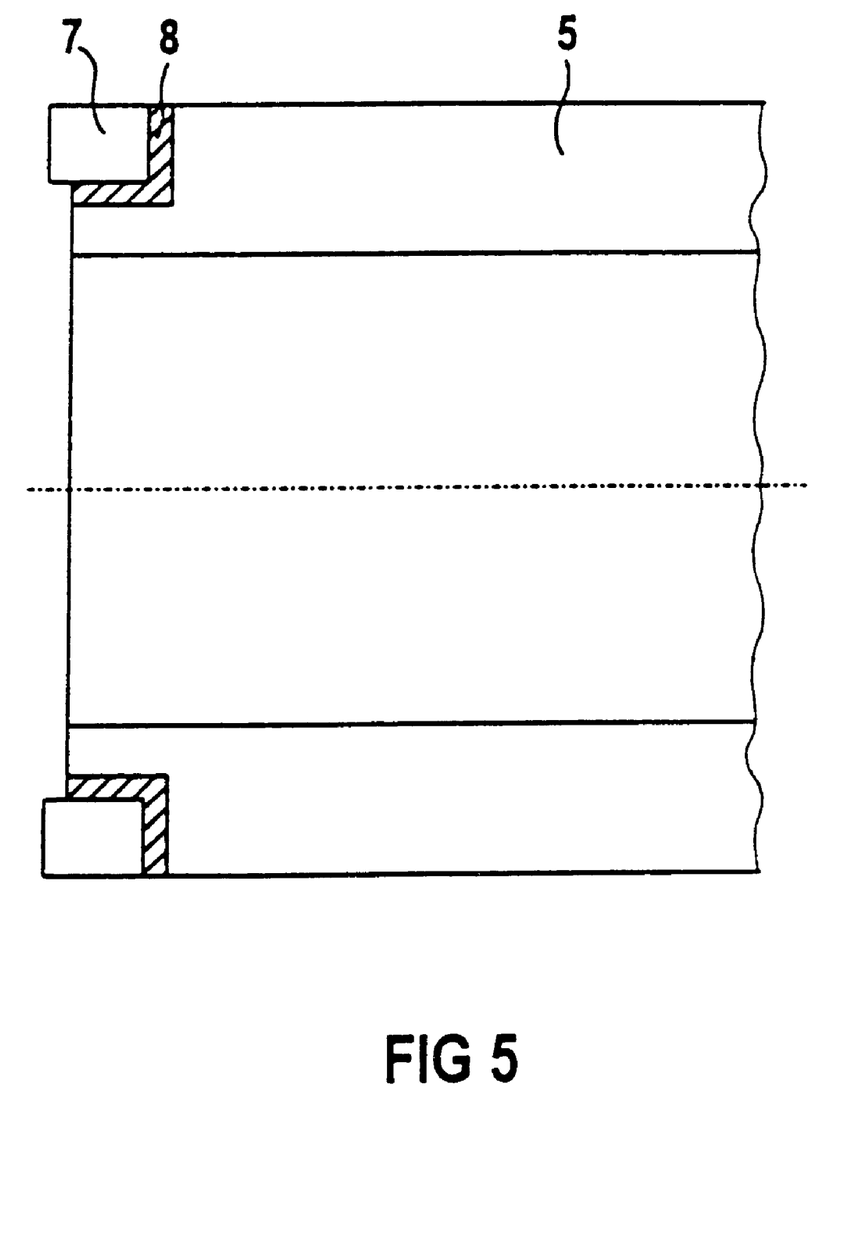
FIG. 5 is a longitudinal section of a tube-shaped gradient coil system with an end ring and an intermediate layer made of elastic material.

FIG. 5 shows a longitudinal section of a tubular gradient coil system 5 with an end ring 7 that is fastened at the gradient coil system via an intermediate layer 8 made of elastic material.

Materials of high density are advantageous forth weights and end rings in order to obtain heavy weights with a small volume. Inexpensive materials are metals such as lead and other solid materials such as glass. When electrically conductive materials are, utilized, their eddy current behavior must be considered with respect to the design of the gradient coils system.

Figure 6:
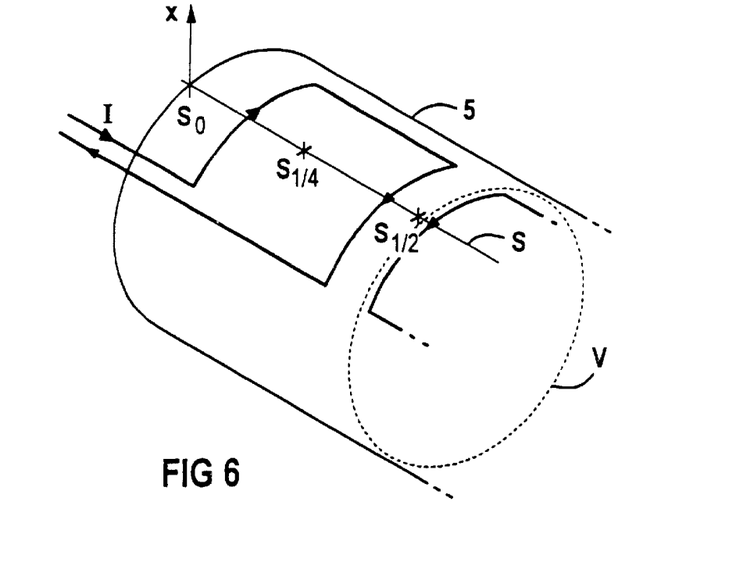
FIG. 6 schematically illustrates one of four coils as a section of a gradient coil system without active shielding and without the inventive fashioning of the conductor arrangement.

FIG. 6 is a schematic diagram showing a simplified section of the gradient coil for a physical spatial axis shown in FIG. 1, namely the left upper part of the gradient coil. Only one of the four saddle coils with only one exemplary winding is shown. The shown coil is a part of a gradient coil system without active shielding. In addition, the physical boundaries of the tubular gradient coil system 5 are shown in FIG. 6. An intersection line S with points $S_{O2}$, $S_{1/4}$ and $S_{1/2}$ also is shown in FIG. 6. These points are also designated in each of FIGS. 7–20. Further, a circular circumferential line V of the imaging volume (assumed as spherical) in the area of the point $S_{1/2}$ of the intersection line S, is shown in broken lines.

Figure 7:
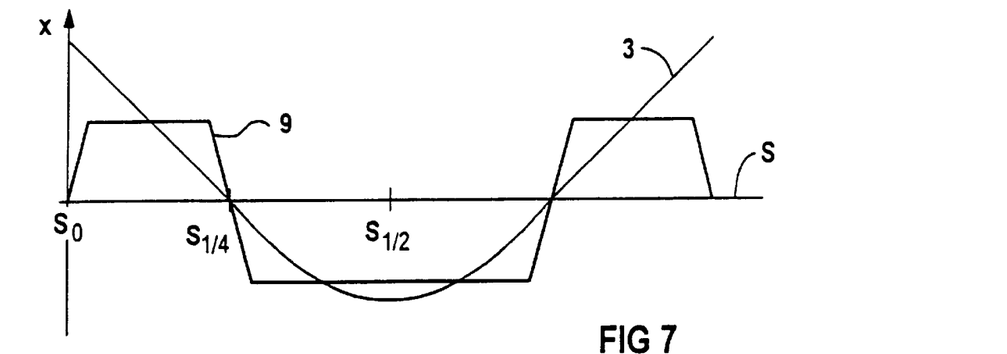
FIG. 7 shows the Lorentz force distribution and the noise-producing natural oscillation mode of the gradient coil system for FIG. 6.

FIG. 7 shows two curves along the intersection line S and in the direction of the coordinate axis x from FIG. 6. Curve 9 shows the basic Lorentz force distribution for the gradient coil without active shielding from FIG. 6 and curve 3 shows the relevant natural oscillation mode of the gradient coil system, which is the one that is relevant for producing noise in the gradient coil system according to FIG. 6.

Figure 8:
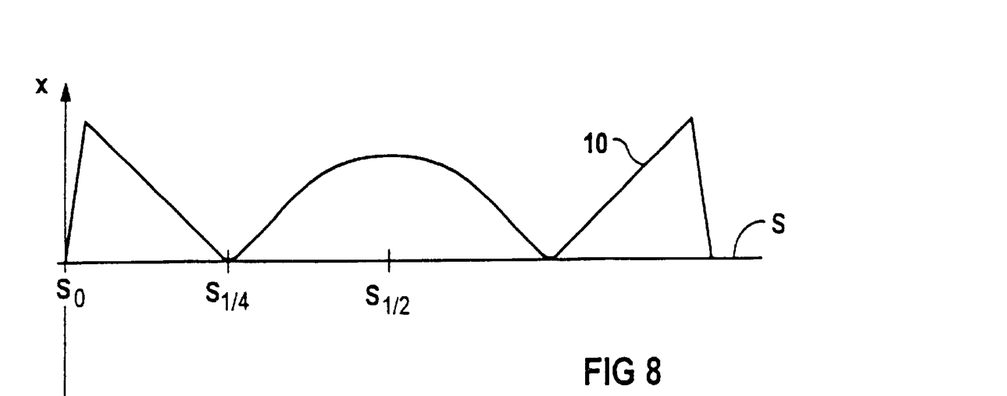
FIG. 8 is a curve resulting from multiplication of the Lorentz force distribution and the natural oscillation mode in FIG. 7.

FIG. 8 shows a curve 10 that is derived from the curves 3 and 9 of FIG. 7 by means of multiplication. As previously described, an integration of the curve 10 along the intersection line S leads to a characteristic number that is a measuring number for the occurring noise given execution of a pulse sequence. A value of the characteristic number that is as close to zero as possible means no noise contribution or an extremely small contribution to noise by the relevant natural oscillation mode; a large magnitude value or absolute value is equivalent to high noise. Since the curve 10 extends exclusively above the intersection line S, an integration along the intersection line S leads to a large characteristic number in terms of magnitude. This means significant noise. This is consistent with the underlying premise, since the relevant natural oscillation mode, by definition, would otherwise not be a noise-producing natural oscillation form.

Figure 9:
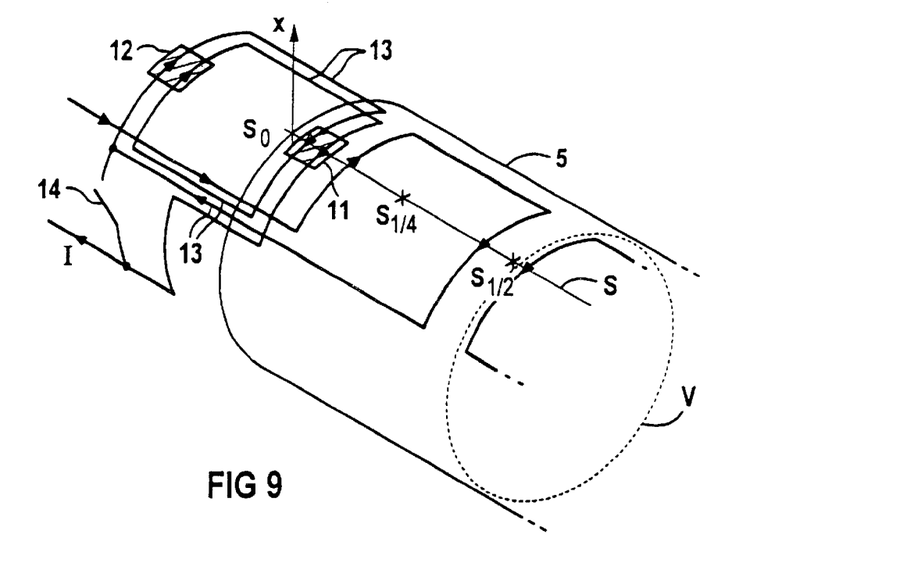
FIG. 9 schematically illustrates one of four coils as a section of a gradient coil system without active shielding, with the inventive fashioning of the conductor arrangement.

Proceeding from the coil shown in FIG. 6, FIG. 9 shows a gradient coil having conductor sections added in a first area 11 in the end region of the gradient coil system, these conductor sections having the gradient coil current I flowing therein. The corresponding connection of the conductor sections is, for example, realized outside of the gradient coil system for forming a complete circuit. For this purpose, twelve conductor sections, corresponding to the number of the above-identified additional conductor sections, are arranged outside of the gradient coil system in a second area, with the conductor sections of both above-identified areas being connected to one another by corresponding couplers 13. Further, a switching element 14 is provided with which the additional windings can be short-circuited, so that the gradient coil current I flows only in one coil according to FIG. 6. This is particularly advantageous when the gradient coil is also operated with pulse sequences which do not excite or barely excite the relevant natural oscillation mode with regard to oscillations. In a different embodiment, the switching element is a simple detachable connecting strap. This is particularly advantageous when the second area 12 is arranged within the gradient coil system and when it is decided in the course of the manufacture, for example, whether the additional conductor sections are permanently connected.

Figure 10:
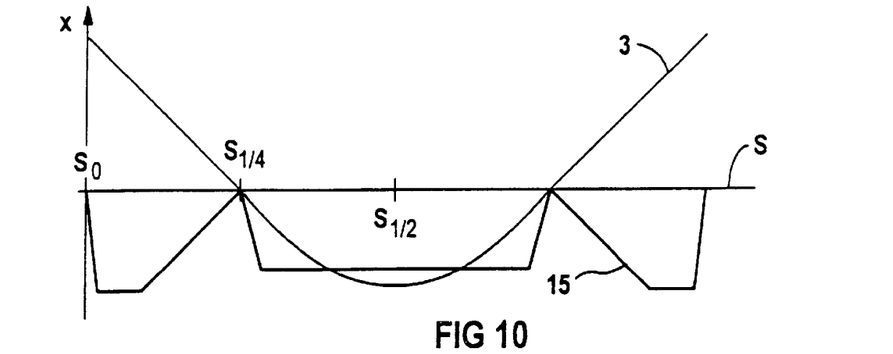
FIG. 10 shows the Lorentz force distribution and the natural oscillation mode of the gradient coil system of FIG. 9.

FIG. 10, in turn, shows two curves along the intersection line S and in the direction of the coordinate axis x from FIG. 9. Curve 3, in turn, shows the relevant natural oscillation mode, whereby it is assumed that the additional conductor sections only insignificantly change the natural oscillation mode. Curve 15 shows the basic Lorentz force distribution given an open switch. In contrast to the Lorentz force distribution of FIG. 7, the Lorentz force distribution has changed sign in the areas remote from the imaging volume between $S_0$ and $S_{1/4}$ with respect to the intersection line S.

Figure 11:
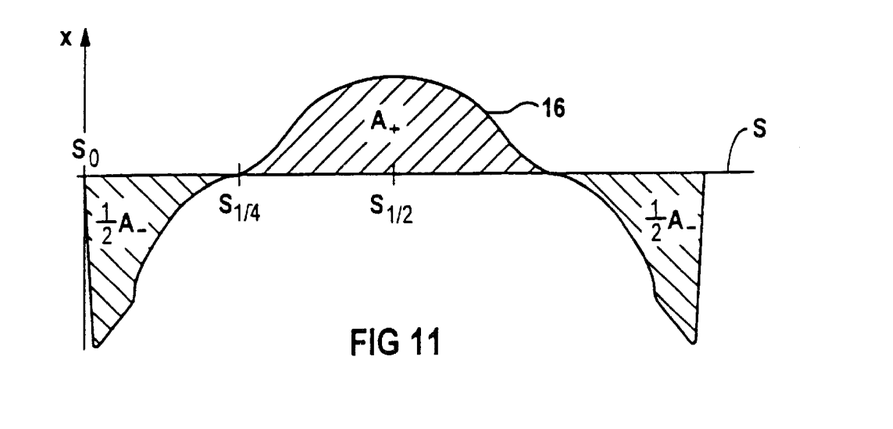
FIG. 11 is a curve resulting from multiplication of the Lorentz force distribution and the natural oscillation mode of FIG. 10.

FIG. 11 shows a curve 16 that is derived from the curves 3 and 15 of FIG. 10 by multiplication. As previously described, an integration of the curve 16 along the intersection line S leads to a characteristic number that is a measuring number for the noise that occurs when executing a pulse sequence. Since the curve 16, with the intersection line S, forms areas $A_+$ and $A_-$ ($A_-$ being comprised of two areas each designated ½ $A_-$) of approximately the same size above the intersection line S and below the intersection line S, an integration along the intersection line S leads to a value that is close to zero. Given a coil design according to FIG. 9, this means that the relevant natural oscillation mode causes almost no noise when executing pulse sequences. Therefore, the relevant natural oscillation mode can no longer be referred to as noise-producing.

Figures 12, 13:
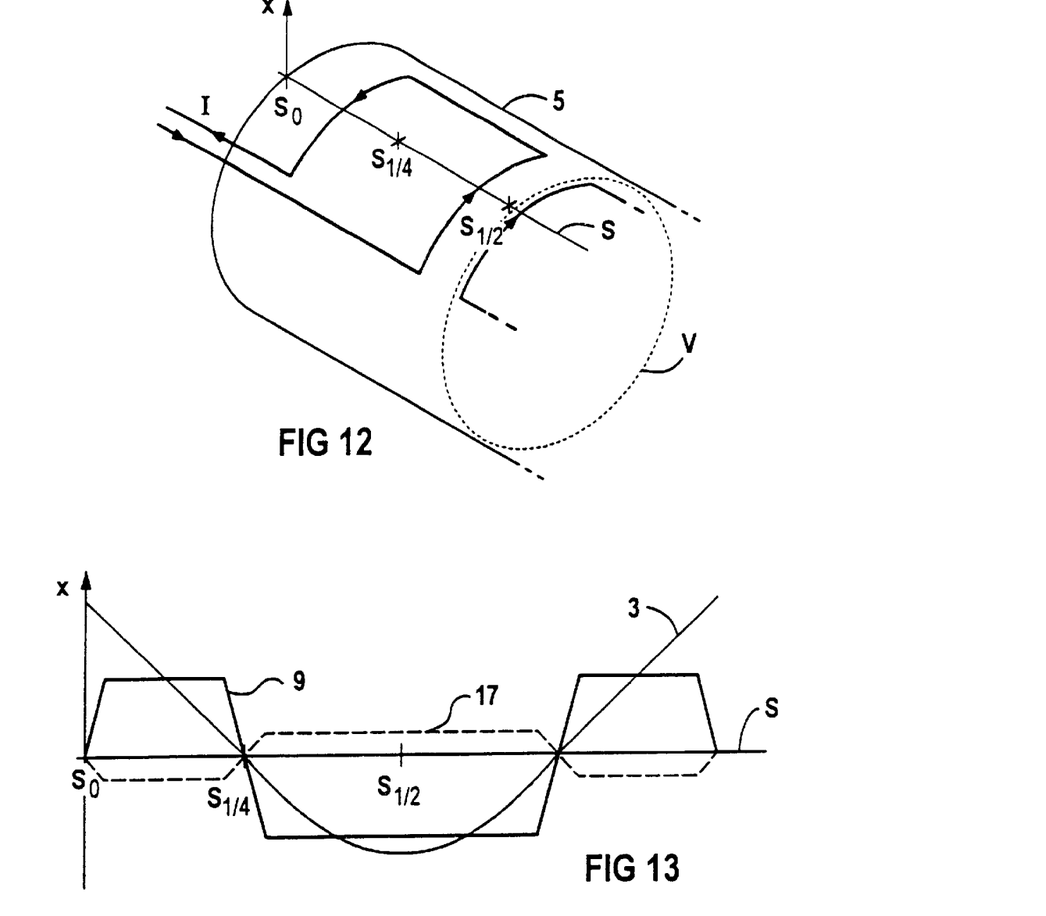
FIG. 12 schematically illustrates one of four secondary coils as a section of a gradient coil system with a primary coil and a secondary coil, without the inventive fashioning of the conductor arrangement.
FIG. 13 shows the Lorentz force distributions for the primary coil and the secondary coil and the noise-producing natural oscillation mode of the gradient coil system of FIG. 12.

In the form of a schematic diagram, FIG. 12 shows a section of a secondary coil. Given gradient coils that are surrounded by electrically conductive structures, the electromagnetic alternating fields, which are radiated by the gradient coils, cause eddy currents in the conductive structures that surround the coils. A typical example is the inner cold shield given a magnetic resonance tomography device with a superconducting basic field magnet. These eddy currents are undesired, since they weaken and distort the gradient field, for example. These effects can be compensated by means of an active shielding. For achieving the active shielding, a coil referred to as a secondary coil is concentrically arranged, with a larger radius, around the coil referred to as the primary coil, which is shown in FIG. 6 and which generates the actual gradient field, within the gradient coil system. The secondary coil is connected in series to its appertaining primary coil electrically in the opposite direction and is dimensioned such that the electromagnetic alternating field is minimized at the conductive structures. The usable gradient field in the imaging volume is thereby somewhat reduced. FIG. 12 also shows only one winding of the secondary coil as an example.

FIG. 13 shows three curves along the intersection line S and the coordinate axis x of FIG. 12. Curve 9 shows the known basic Lorentz force distribution of the primary coil, curve 17 shows the Lorentz force distribution of the secondary coil and curve 3 shows the relevant natural oscillation form of the gradient coil system. It is assumed that the natural oscillation mode does not basically change due to the conductor sections of the secondary coil.

Figure 14:
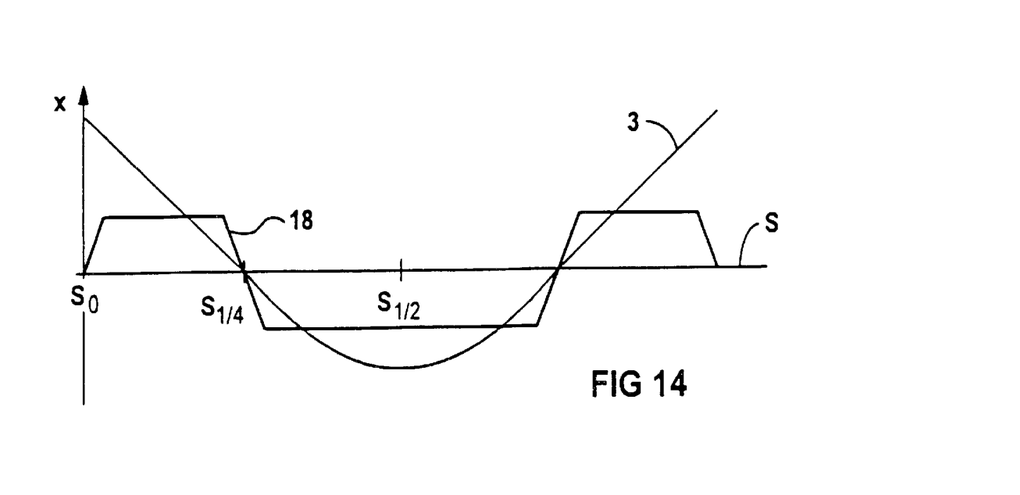
FIG. 14 shows the Lorentz force distribution of the gradient coil system, including a primary coil and a secondary coil, as well as the natural oscillation mode of FIG. 12.
Figure 17:
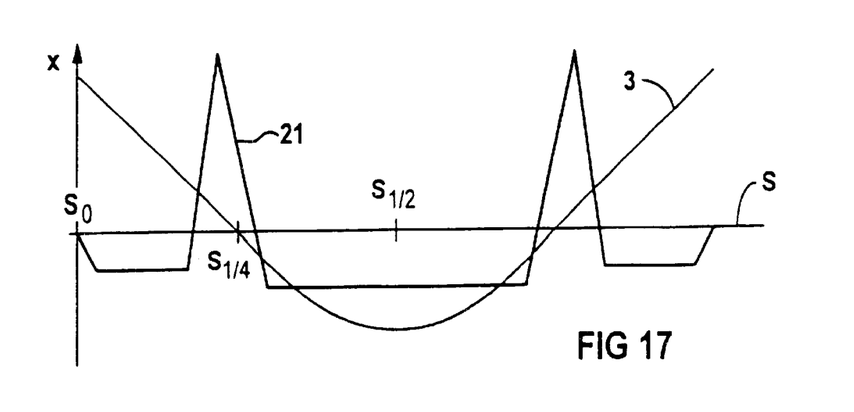
FIG. 17 shows the Lorentz force distribution of the gradient coil system, including a primary coil and a secondary coil, as well as the natural oscillation mode of FIG. 15.

FIG. 14, in turn, shows the relevant natural oscillation mode 3 and a curve 18, which shows the Lorentz force distribution for the gradient coil system from FIG. 12, including the primary coil and secondary coil, and which derives from the two Lorentz force distributions 9 and 17 from FIG. 17 by summation. A multiplication of both curves shown in FIG. 14 leads to a curve that is similar to the one shown in FIG. 8, so that an integration of the multiplication result curve leads to a characteristic number that is large in magnitude with respect to the noise.

Figure 15:
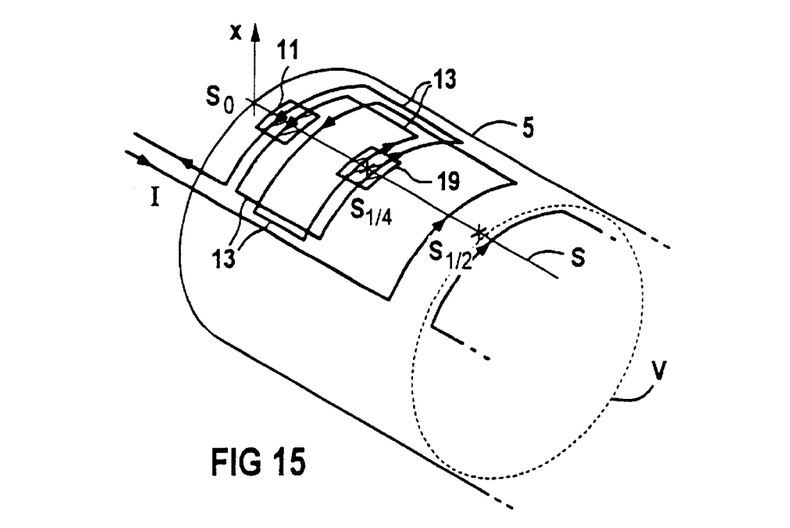
FIG. 15 schematically illustrates one of four secondary coils as a section of the gradient coil system with a primary coil and a secondary coil with the inventive fashioning of the conductor arrangement.

FIG. 15 shows the secondary coil that is shown in FIG. 12, this secondary coil has additional conductor sections in the end region of the gradient coil system and in the area of an oscillation node of the natural oscillation mode 3, namely in the area of $S_{1/4}$ at which the natural oscillation mode 3 cuts the intersection line S. For that purpose, a number of conductor sections, which have a gradient coil current flowing therein in a first direction, are arranged in a first area 11 that is remote from the imaging volume. The same number of conductor sections, which having a gradient coil current flowing therein opposite to the first direction, are arranged in a second area 19, whereby the oscillation node of the relevant natural oscillation mode also falls in the spatial area of the second area 19. The conductor sections of both areas 11 and 19 are connected to one another by means of corresponding couplers 13 and are connected with the other conductor sections of the secondary coil to a complete circuit. Only a few conductor sections are shown as examples.

Figure 16:
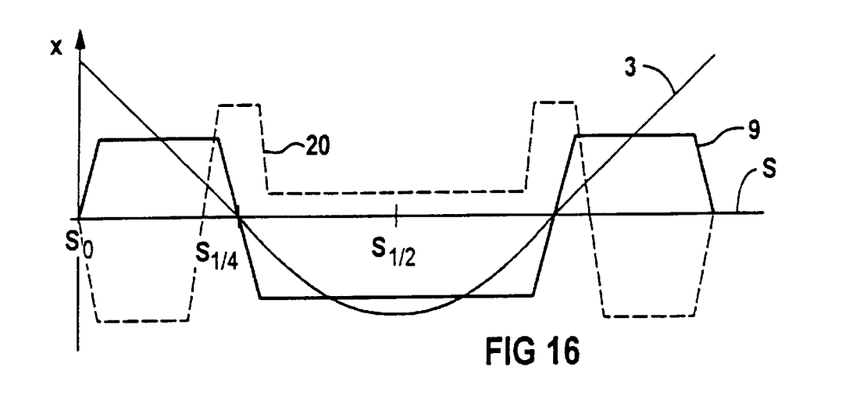
FIG. 16 shows the Lorentz force distributions for the primary coil and the secondary coil, as well as the natural oscillation mode of the gradient coil system of FIG. 15.

FIG. 16 shows three curves along the intersection line S and along the coordinate axis x from FIG. 15. Curve 9 shows the known Lorentz force distribution of the primary coil from FIG. 6, curve 3 shows the relevant natural oscillation mode of the gradient coil system, whereby it is assumed that the additional conductor sections of the secondary coil change it only insignificantly, curve 20 shows the Lorentz force distribution of the secondary coil from FIG. 15.

FIG. 17 shows the relevant natural oscillation mode 3 and a curve 21, which shows the Lorentz force distribution of the gradient coil system, including the primary coil from FIG. 6 and the secondary coil from FIG. 15 that lies thereupon. The curve 21 is derived from the two Lorentz force distributions from FIG. 16 by summing. A multiplication of both curves in FIG. 17 leads to a curve that is similar to the one shown in FIG. 11, so that an integration of the multiplication result curve results in a characteristic number that is close to zero; representing low noise. It should be particularly stressed that the conductor sections, which are introduced in FIG. 15 in the end area of the gradient coil system for the fashioning of the Lorentz force distribution, are connected to a complete circuit by means of conductor sections in the area of an oscillation node of the natural oscillation mode, without the conductor sections in the area of the oscillation node significantly determining the noise optimization. This arises from the fact that the comparatively large Lorentz forces are multiplied with values close to zero of the natural oscillation mode and therefore provide only small contributions to the integration result given the multiplication of the Lorentz force distribution in the area of the oscillation nodes.

Figure 18:
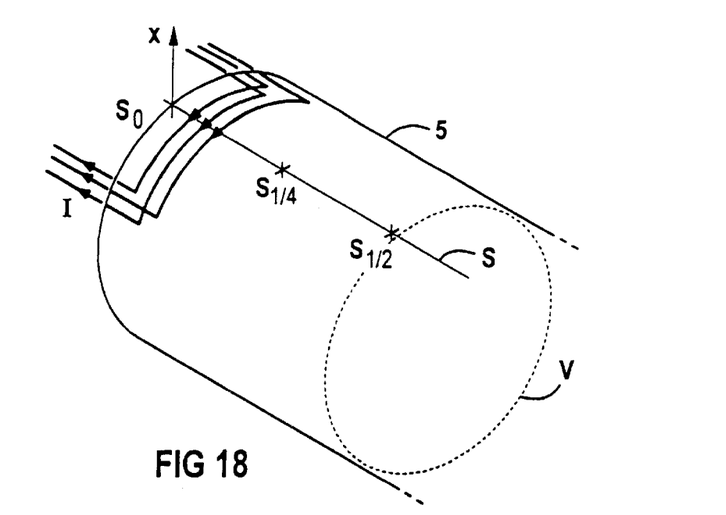
FIG. 18 schematically illustrates additional conductor sections in a winding layer above the primary coil and secondary coil as a section of a gradient coil system.

In a third winding layer above the primary coil and secondary coil from FIG. 12, FIG. 18 shows the arrangement of additional conductor sections as an example, in which the gradient coil current I flows.

Figure 19:
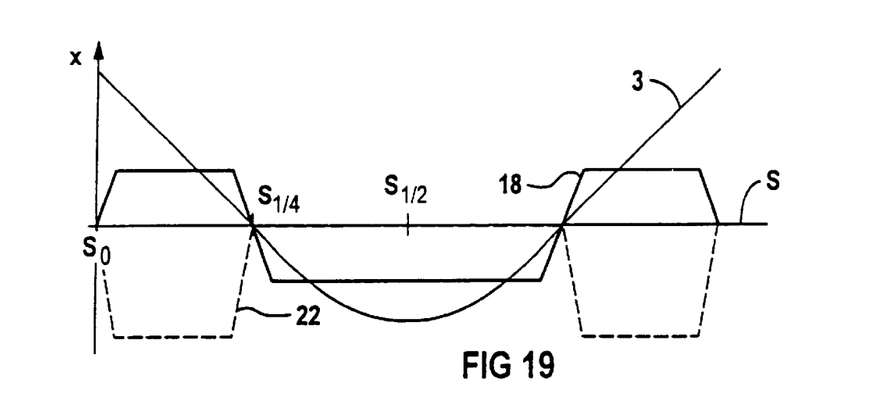
FIG. 19 shows the Lorentz force distribution for the system of a primary coil and a secondary coil, as well as the Lorentz force distribution of the additional conductor sections and the natural oscillation mode of the gradient coil system of FIG. 18.

FIG. 19 shows the known Lorentz force distribution 18 of the primary coil and secondary coil, and shows the relevant natural oscillation mode 3, it being assumed that the additional conductor sections in the third layer only insignificantly change the natural oscillation mode. FIG. 19 also shows the basic Lorentz force distribution 22 of the additional conductor sections in the third layer from FIG. 18 along the intersection line S and the coordinate axis x.

Figure 20:
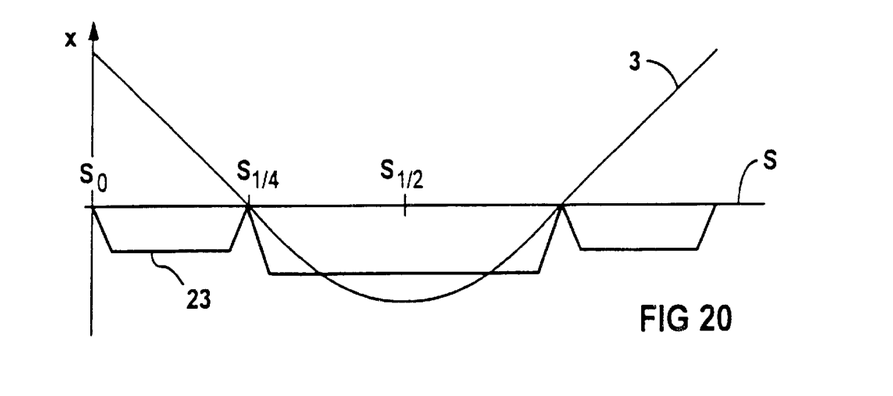
FIG. 20 shows the Lorentz force distribution of the gradient coil system, including a primary coil and a secondary coil and additional conductor sections, as well as the natural oscillation mode of FIG. 18.

FIG. 20 shows the relevant natural oscillation mode 3 and the Lorentz force distribution 23 of the gradient coil system in FIG. 18, which is derived from adding the two Lorentz force distributions from FIG. 19. A multiplication of the curves 3 and 23 leads to a curve that is similar to the one shown in FIG. 11, so that an integration of the multiplication result curve results in a characteristic number that is close to zero; this represents low noise.

Thus there are shown three possibilities for setting the Lorentz force distribution to optimize the noise-modifying the design of the primary coil, modifying the design of the secondary coil, and an additional winding layer. These can be arbitrarily combined for achieving a noise-optimized behavior of the gradient coil system.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance tomography device having a basic field magnet, which generates a static magnetic field, and a gradient coil system, having a plurality of structurally-related natural oscillation modes and being comprised of gradient coils and a carrier structure, and having a gradient current flowing therein which interacts with the static magnetic field to produce Lorentz forces which cause said gradient coil system to oscillate, the improvement comprising:

said gradient coil system having a structural design dependent on said structurally-related natural oscillation so that, for each of said structurally-related natural oscillation modes, a scalar product of said structurally-related natural oscillation mode and the Lorentz force acting on each point of said gradient coil system, summed over all points of said gradient coil system, produces a value which is minimized toward zero.

2. The improvement of claim 1 wherein, in said structural design of said gradient coil system, only structurally-related natural oscillation modes which contribute to noise generation, by oscillating said gradient coil system, have said scalar product minimized toward zero.

3. The improvement of claim 1 wherein said structural design comprises a weight distribution of said carrier structure.

4. The improvement of claim 1 wherein said structural design comprises a plurality of weights introduced into said carrier structure.

5. The improvement of claim 1 wherein said structural design comprises a rigidity distribution of said carrier structure.

6. The improvement of claim 1 wherein said structural design comprises components introduced into said carrier structure which alter an elastic rigidity of said carrier structure.

7. The improvement of claim 1 wherein said carrier structure comprises a tube having a tube cross-section, and wherein said structural design comprises a plurality of rings having a ring cross-section substantially corresponding to said tube cross-section which are rigidly connected to said carrier structure at least at one end of said carrier structure.

8. The improvement of claim 7 wherein said structural design further comprises an intermediate layer of elastic material connecting said rings to said carrier structure.

9. The improvement of claim 8 wherein said elastic material exhibits a force deformation representable in a force deformation diagram wherein said force deformation exhibits a hysteresis loop having an encompassed area which is large so that said elastic material absorbs a substantial amount of oscillation energy in said gradient coil system.

10. The improvement of claim 9 wherein said rings are composed of high density material.

11. The improvement of claim 1 wherein said structural design comprises a physical conductor arrangement of said gradient coils to prescribe said Lorentz forces.

12. The improvement of claim 11 wherein said gradient coils include a primary coil and a secondary coil, and wherein said Lorentz forces are prescribed by a physical conductor arrangement of said secondary coil.

13. The improvement of claim 11 wherein said gradient coils include a primary coil in a winding layer and at least one conductor section disposed outside of said winding layer and integrated into at least one gradient coil circuit of said gradient coils, said structural design comprising a physical conductor arrangement of said at least one conductor section.

14. The improvement of claim 11 wherein said magnetic resonance tomography device has an imaging volume, and wherein said physical conductor arrangement is disposed within said gradient coil system at a location which is as remote as possible from said imaging volume.

15. The improvement of claim 11 wherein said physical conductor arrangement is disposed in an area of said gradient coil system which includes at least one oscillation node of at least one of said structurally-related natural oscillation modes.

16. The improvement of claim 15 wherein said at least one of said natural oscillation modes comprises a structurally-related oscillation mode which contributes to generation of noise by oscillating said gradient coil system.

17. The improvement of claim 11 wherein said magnetic resonance tomography device has an imaging volume, and wherein said physical conductor arrangement comprises a first group of conductor sections and a second group of conductor sections, said first group of conductor sections comprises more densely bundled conductors than said second group of conductor sections, and wherein said first group of conductor sections Is disposed in an area of said gradient coil system remote from said imaging volume and wherein said second group of conductor sections is disposed in an area of said gradient coil system close to said Imaging volume.

18. The improvement of claim 11 wherein said magnetic resonance tomography device has an imaging volume, and wherein said physical conductor arrangement comprises a first group of conductor sections and a second group of conductor sections, said first group of,conductor sections comprises more densely bundled conductors than said second group of conductor sections, and wherein said first group of conductor sections being disposed in an area of said gradient coil system which includes an oscillation node of at least one of said structurally-related natural oscillation modes, remote from said imaging volume and wherein said second group of conductor sections is disposed in an area of said gradient coil system close to said imaging volume.

19. The improvement of claim 11 wherein said magnetic resonance tomography device has an imaging volume, and wherein said physical conductor arrangement comprises a first area of said gradient coils, disposed remote from said imaging volume, containing a first plurality of conductor sections in which a gradient coil current flows in a first direction perpendicular to said static magnetic field, and at least one second area within said magnetic resonance tomography device containing a second plurality of conductor sections, and a plurality of couplers respectively connecting said first plurality of conductor sections and said second plurality of conductor sections to form a complete electrical circuit.

20. The improvement of claim 19 wherein said second plurality of conductor sections is equal in number to said first plurality of conductor sections.

21. The improvement of claim 19 wherein said second area is disposed outside of said gradient coil system.

22. The improvement of claim 19 wherein said second area is arranged within said gradient coil system and wherein said second plurality of conductor sections have a gradient coil current flowing therein in a direction opposite to said first direction, and wherein said second area includes at least one oscillation node of at least one of said structurally-related natural oscillation modes.

23. The improvement of claim 22 wherein said at least one of said structurally-related natural oscillation modes is a structurally-related oscillation mode which contributes to generation of noise by oscillating said gradient coil system.

24. The improvement of claim 19 further comprising a switching element disposed between said first area and said second area for selectively electrically connecting and disconnecting at least selected ones of said first plurality of conductor sections and said second plurality of conductor sections.

25. The improvement of claim 1 wherein said gradient coils are saddle coils.

* * * * *